United States Patent

Van Doren

[15] 3,646,548

[45] Feb. 29, 1972

[54] NONLINEAR ANALOG-TO-DIGITAL CONVERTER

[72] Inventor: Arnold H. Van Doren, Holliston, Mass.

[73] Assignee: Raytheon Company, Lexington, Mass.

[22] Filed: Jan. 15, 1971

[21] Appl. No.: 106,890

Related U.S. Application Data

[63] Continuation of Ser. No. 734,060, June 3, 1968, abandoned.

[52] U.S. Cl. ....................340/347 AD

[51] Int. Cl. ....................H03k 13/02

[58] Field of Search ....................340/347 AD, 347 CC; 307/235; 328/143, 144

[56] References Cited

UNITED STATES PATENTS 3,277,462 10/1966 Sekimoto....................340/347

3,283,319 11/1966 Kaneko....................340/347

3,508,250 4/1970 Wells....................340/347

*Primary Examiner*—Thomas A. Robinson

*Attorney*—Harold A. Murphy and Joseph D. Pannone

[57] ABSTRACT

A high speed nonlinear analog-to-digital converter for producing a nonlinear or logarithmic transfer function which utilizes a parallel bank of nonlinear comparators and a parallel bank of linear comparators. The effective gain of the linear comparators is varied depending upon the portion of the logarithmic scale selected by the nonlinear comparators. This variation in gain is accomplished by changing the reference voltage of the linear comparators to coincide with the region of the input range in which the signal lies. The data flow through the converter is timed such that the nonlinear comparators are working on a second sample while the linear comparators are working on the first sample. All data from a complete sample arrives at the output terminals simultaneously.

11 Claims, 9 Drawing Figures

INVENTOR
ARNOLD H. VAN DOREN
BY Irving S. Rappaport
ATTORNEY

INVENTOR
ARNOLD H. VAN DOREN

BY Irving S. Rappaport
ATTORNEY

INVENTOR
ARNOLD H. VAN DOREN
BY Irving S. Rappaport
ATTORNEY

INVENTOR
ARNOLD H. VAN DOREN
BY Irving S. Rappaport
ATTORNEY

INVENTOR
ARNOLD H. VAN DOREN
BY Irving S. Rappaport
ATTORNEY

NONLINEAR ANALOG-TO-DIGITAL CONVERTER

This application is a continuation of application Ser. No. 734,060, filed June 3, 1968 and now abandoned.

BACKGROUND OF THE INVENTION

There are various types of prior art nonlinear analog-to-digital converters. One technique used in PCM systems uses a switched gain amplifier where the gain of the amplifier is switched to a low value when the input signal crosses a given threshold. The switched amplifier technique provides only a two-straight line segment approximation and is a relatively slow approach. Other prior art converters have employed a single bank of nonlinear weighted comparators. Although this type of approach yields high speeds, it is limited to a very small number of bits. Another approach to nonlinear analog-to-digital converters utilizes an operational amplifier but the operating speed is greatly limited.

Still another prior art approach employs a technique of successive approximation. It this technique different portions of the logarithmic scale are selected in a trial and error process to approximate the desired nonlinear transfer function. The successive approximation technique can only convert one bit of information for each clock pulse period and therefore, it is limited to operating speeds around 1 Mhz. with eight bits. Further, this technique is designed for high accuracy, low-speed applications. In addition, the successive approximation technique has a relatively long aperture time. Aperture time is defined as the maximum time "uncertainty" of digitization which is the maximum time required to achieve the specified accuracy of the converter. In the successive approximation technique, the aperture time equals the conversion time which is approximately one microsecond.

The present invention provides a nonlinear analog-to-digital converter which is designed for very high speed operation. The present invention uses parallel banks of comparators in a parallel, feed-forward configuration in which whole words are converted at one time rather than individual bits as in the successive approximation technique. The converter of the present invention is capable of operating at speeds of 15 Mhz. with eight bits and possibly faster. The present converter does not operate on a trial and error basis as in the successive approximation technique but rather immediately and automatically selects that voltage of the logarithmic scale in which the signal lies by use of the bank of parallel, nonlinear comparators. Also, a straight approximation of the desired transfer function is obtained from the converter of the present invention rather than the derivation of discrete points on the logarithmic scale as in the successive approximation technique. Finally, the aperture time of the present converter is limited to only the delay line mismatches and minor circuit differences. As a result, this aperture time is on the order of 15 to 20 nanoseconds.

SUMMARY OF THE INVENTION

The above advantages and features of the present invention as well as others are achieved by providing a nonlinear analog-to-digital converter for converting an analog input signal into a digital output signal, said converter comprising a plurality of parallel-connected, nonlinearly weighted means for determining the portion of the nonlinear scale in which the input voltage lies; a plurality of parallel-connected, linearly weighted means for dividing the selected portion of the nonlinear scale into straight line segments; means for varying a reference voltage which is applied to the linearly weighted means so as to coincide with the portion of the nonlinear scale in which the input voltage lies; means for deriving parallel bits of digital output information simultaneously; and means for timing the signals so that the nonlinearly weighted means operate on the second input signal while the linearly weighted means operate on the first input signal.

BRIEF DESCRIPTION OF THE DRAWINGS

FIG. 1 shows a nonlinear analog-to-digital converter 10 employing the present invention. Converter 10 is a five-bit converter but is shown as a five bit converter only for purposes of explanation of the present invention. The present invention may be employed in a converter designed to convert any desired number of bits. The analog input signal is supplied to a buffer amplifier 12 in order to make all input signals appear as if they were at the same polarity to the converter 10. Also the buffer amplifier 12 eliminates exposure of the input signal to the nonlinearities of the switching comparators.

The converter 10 employs a combination of parallel and feed-forward techniques in the following manner. The output from the buffer amplifier 12 is applied in parallel to a bank of seven parallel "$a$" comparators 14 which are weighted nonlinearly by resistors 16 corresponding to each of the "$a$" comparators 14. In the present example, the logarithmic transfer function shown in FIG. 2 will be used in describing the conversion performed by converter 10. The "$a$" comparators 14 perform a logarithmic conversion immediately and automatically by determining between which two bits on the logarithmic scale the voltage to be measured lies. This conversion determines which region between the logarithmic break points $a_1$, $a_2$, etc., in which the voltage lies. The nonlinear weighting resistors 16 correspond to the various regions of the logarithmic scale between the logarithmic break points $a_1$, $a_2$, etc. The operation of the "a" comparators 14 decides the positioning of the first three bits or seven most significant levels of the five-bit word to be derived at the output. FIG. 4A shows the analog input signal and the voltage point of the signal which is to be converted.

Figure 2:
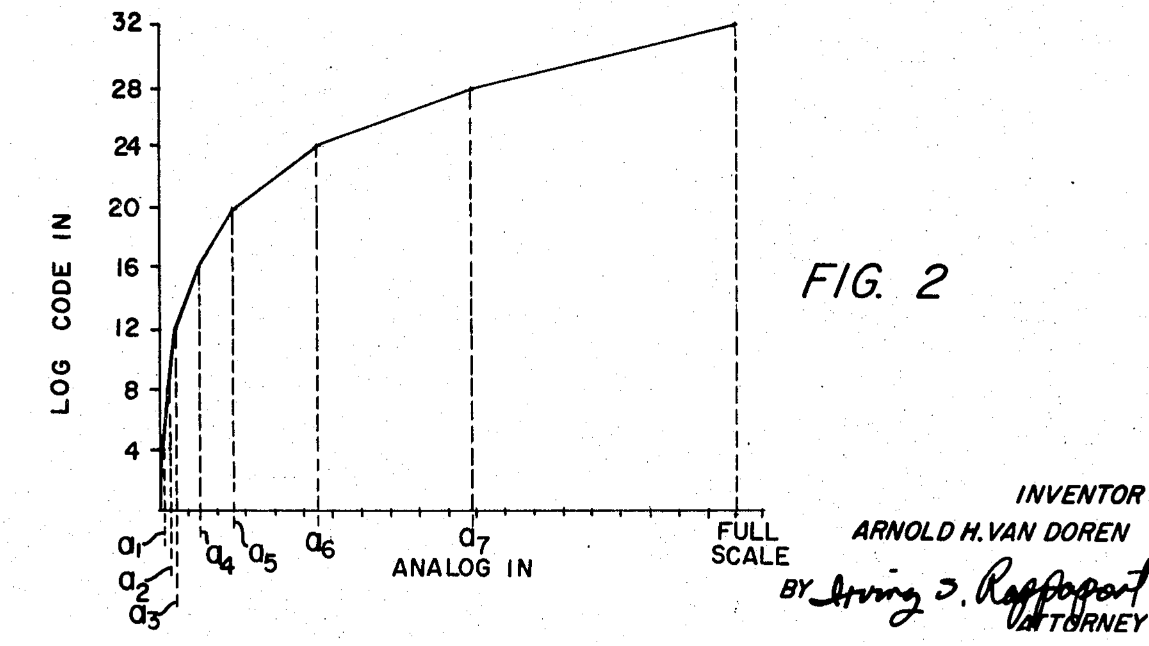
FIG. 2 is a graph of a logarithmic transfer function as might be converted by the present invention.
Figure 4:
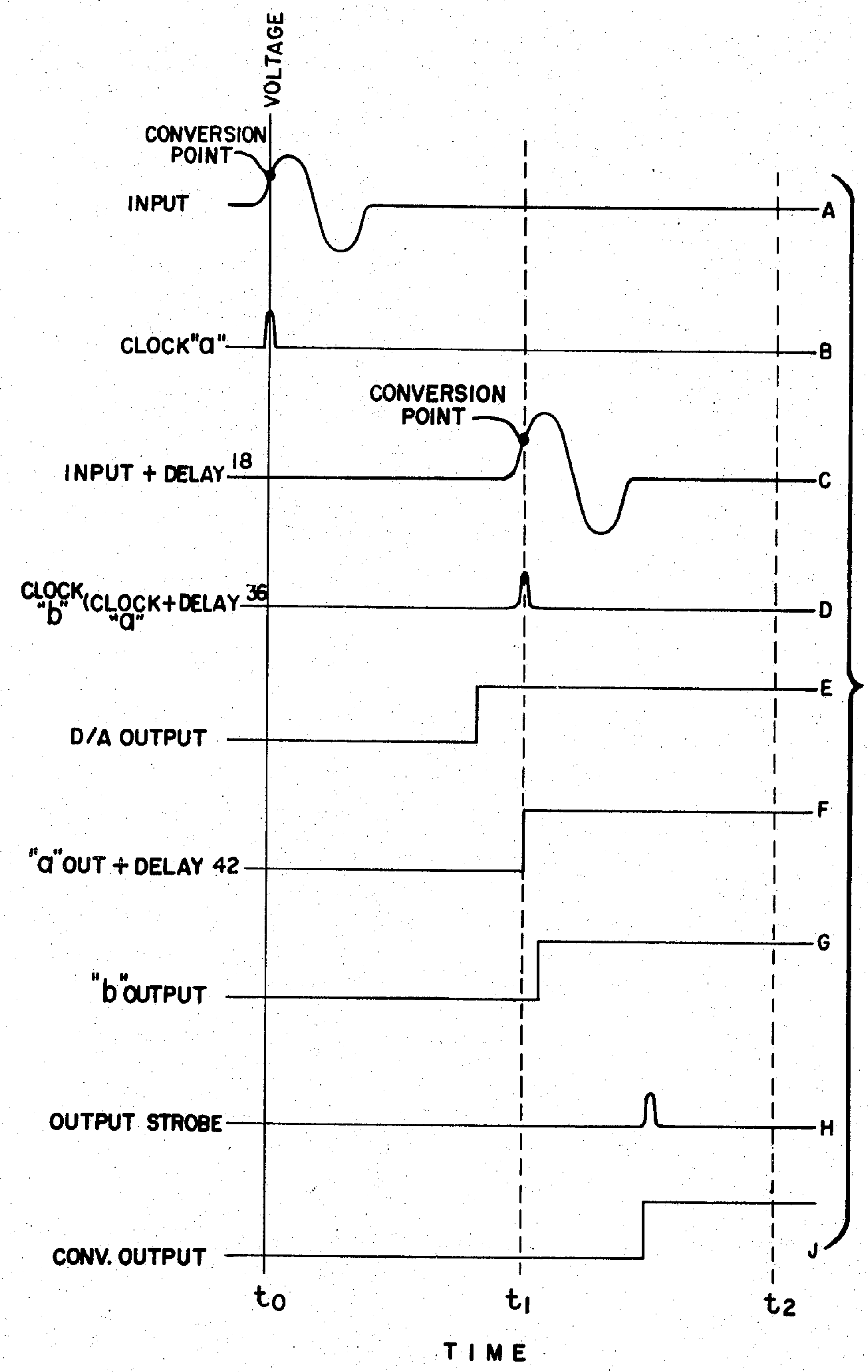
FIG. 4 shows the various signals derived from the operation of the converter shown in FIG. 1.

The operation of the "$a$" comparators 14 position the logarithmic break points $a_1$–$a_7$ shown in FIG. 2. At the same time that the input analog signal is fed to the "$a$" comparators 14 it is also delayed by the delay line 18 as shown in FIG. 4C. The outputs from the "$a$" comparators 14 accomplish two things. They subtract the highest level digitized from the analog input signal to allow the differences to be digitized into the lower two bits by a bank of three linear "$b$" comparators 20. The "$a$" comparators 14 also alter the value of a variable reference supply 22 which is fed from the output of the "$a$" comparators 14 via a line 24. The "$a$" comparator outputs are encoded into binary by a binary encoder 26. The output from binary encoder 26 is applied to a digital-to-analog converter 28 via a line 30. The output from the converter 28 is shown in FIG. 4E. The output from the delay line 18 and the output from the digital-to-analog converter 28 are applied to a summing circuit 32 which subtracts the output from converter 28 from the delayed input analog signal. These two signals are of opposite polarity and therefore the summing circuit 32 provides the difference.

An input clock signal shown in FIG. 4B strobes the "$a$" comparators 14 via a line 34 and is delayed by a basic clock period in delay line 36 as seen in FIG. 4D before it is applied via line 38 in parallel to the "$b$" comparators 20. The delay provided by delay line 36 is such that the clock pulse arrives at the "$b$" comparators 20 in time to strobe the input signal at the same point that it caused conversion in the "$a$" comparators 14. The relatively short aperture time of converter 10 is possible because of this coincidence. A fixed reference supply 40 supplies a very accurate standard voltage for both the nonlinearly weighted resistors 16 and the variable reference 22.

The outputs from the "$a$" comparators 14 condition the variable reference 22 via line 24 so that the variable reference 22 selects the "b" comparators 20 gain according to the portion of the logarithmic scale in which the voltage lies. Each of the "b" comparators 20 has corresponding linearly weighted resistors 41 which helps determine the necessary gain. At the same time, the output from the binary encoder 26 is delayed by the highest sampling frequency clock period in delay line 42 and the corresponding output is seen in FIG. 4F.

While the "a" comparators 14 divide the analog input signal in a nonlinear fashion, the "b" comparators 20 divide the section of the logarithmic scale selected by the "a" comparators 14 in to four linear segments. The output from the "b" comparators 20 are fed to a binary encoder 44 whose output shown in FIG. 4G is applied to an output register 46. At the same time that the two-bits of information from the "b" comparators 20 arrive at the output register 46, the delayed information from the "a" comparators 14 is also available to the register 46. In other words, the outputs from the "a" and "b" comparators 14 and 20 respectively arrive simultaneously at the output register providing the converted analog information as five bits of digital data. An output strobe shown in FIG. 4H is applied to the output register 46 via a line 48 and is delayed an appropriate amount of time from the input clock so that all five bits are simultaneously strobed out of the output register 46 in parallel. FIG. 4J shows the converted output.

In referring to FIG. 2 it can be seen that the regions between the different logarithmic break points $a_1$–$a_7$ differ in length. For instance, the distance between $a_6$ and $a_7$ is greater than that between $a_1$ and $a_2$. Because of this difference it is necessary to alter the effective gain of the linear "b" comparators 20, depending upon which logarithmic break point $a_1$–$a_7$ the "a" comparators 14 select. This is accomplished by changing the reference voltage of the "b" comparators 20 to coincide with the region of the input range in which the signal lies. This is done by changing the variable reference 22.

Figure 3A:
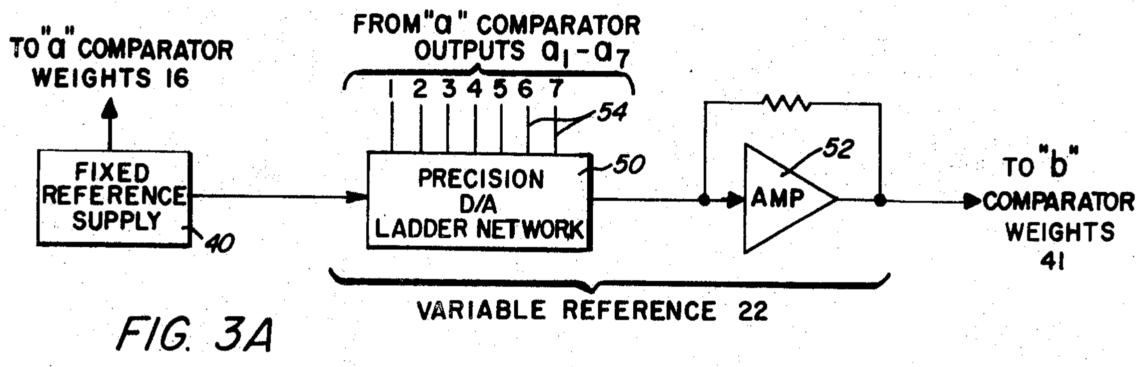
FIG. 3A, B and C shows more detailed diagrams pertaining to the variable reference shown in FIG. 1.

FIG. 3A shows a block diagram of the variable reference 22 which includes a precision digital-to-analog ladder network 50 whose output is connected to an amplifier 52. The ladder network 50 has seven inputs 54, each of which is derived from the output of the corresponding "a" comparators 14. The output from the amplifier 52 is connected to the linearly weighted resistors 41 which are connected to the "b" comparators 20.

Figure 3B:
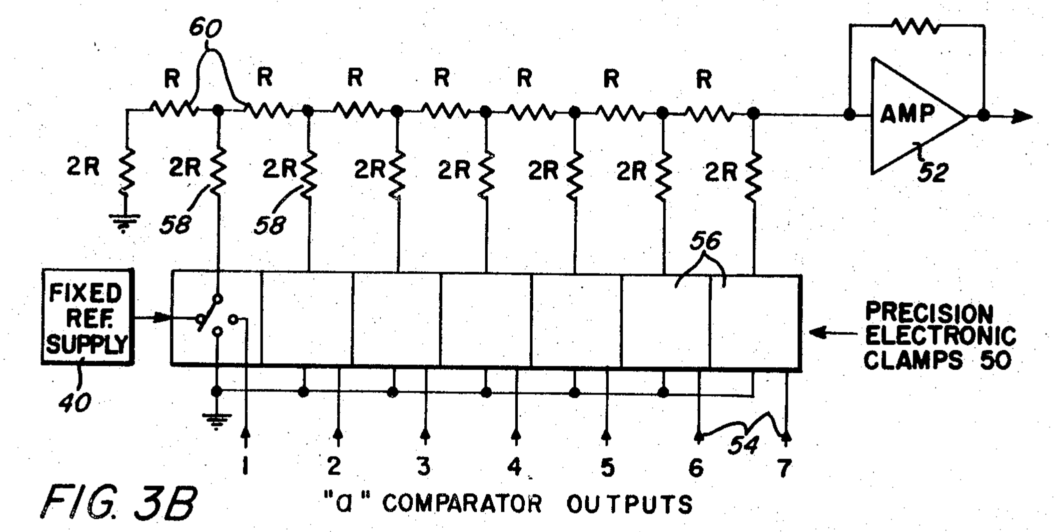
Figure 3C:
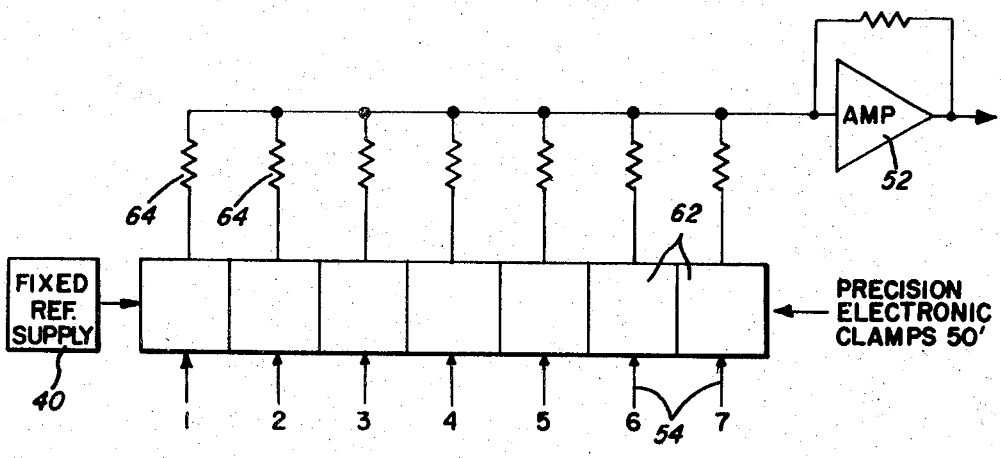

FIG. 3B shows a more detailed diagram of the ladder network 50 using a voltage summing ladder network having a logarithmic characteristic. Each of the outputs 54 from the "a" comparators 14 is connected to a precision electronic clamp 56 respectively. Causing each clamp 56 to be connected either to ground or the reference supply 40. The output from each clamp 56 is connected to a resistor network made up of a series-connected resistor 58 having a value 2R and a parallel-connected resistor 60 having a value R. The amplifier 52 is connected to this resistor network made up of resistors 58 and 60. FIG. 3C shows a different type ladder network 50′ which uses a current summing approach. Each of the outputs 54 from the corresponding "a" comparators 14 is connected to a precision electronic clamp 62. The outputs from the clamps 62 are all connected in parallel via resistors 64 to the amplifier 52.

Referring to FIG. 3A with respect to the operation of the variable reference 22, if the analog input signal falls between zero and the $a_1$ logarithmic break point shown in FIG. 2, the output from amplifier 52 will be at some low voltage. None of the "a" comparators 14 will trigger and the "b" comparators 20 will be weighted to fire on very small input signals. If the conversion point of the input signal falls between the logarithmic break points $a_1$ and $a_2$, the $a_1$ comparator 14 will fire, thereby applying a voltage through the corresponding clamp of the ladder network 50 causing the amplifier 52 output to increase. It then requires larger voltage increments in order to fire the "b" comparators 20. As the analog input voltage increases this process continues until the voltage falls between the logarithmic break point $a_7$ and full scale. All seven inputs 54 to the precision ladder network 50 are then energized and the output from the amplifier 52 is at its maximum value. As a result, a very large increment of input voltage is required to trigger the "b" comparators 20. This operation of the variable reference 22 in altering the effective gain of the linear "b" comparators 20 depending upon the logarithmic break point selected by the "a" comparators 14 results in an excellent straight line approximation of the given transfer function. While the voltage summing network 50 shown in FIG. 3b is most useful for the logmetric function, the current summing network 50 shown in FIG. 3c would be most useful where unusual and exoctic transfer functions are desired.

Figure 1:
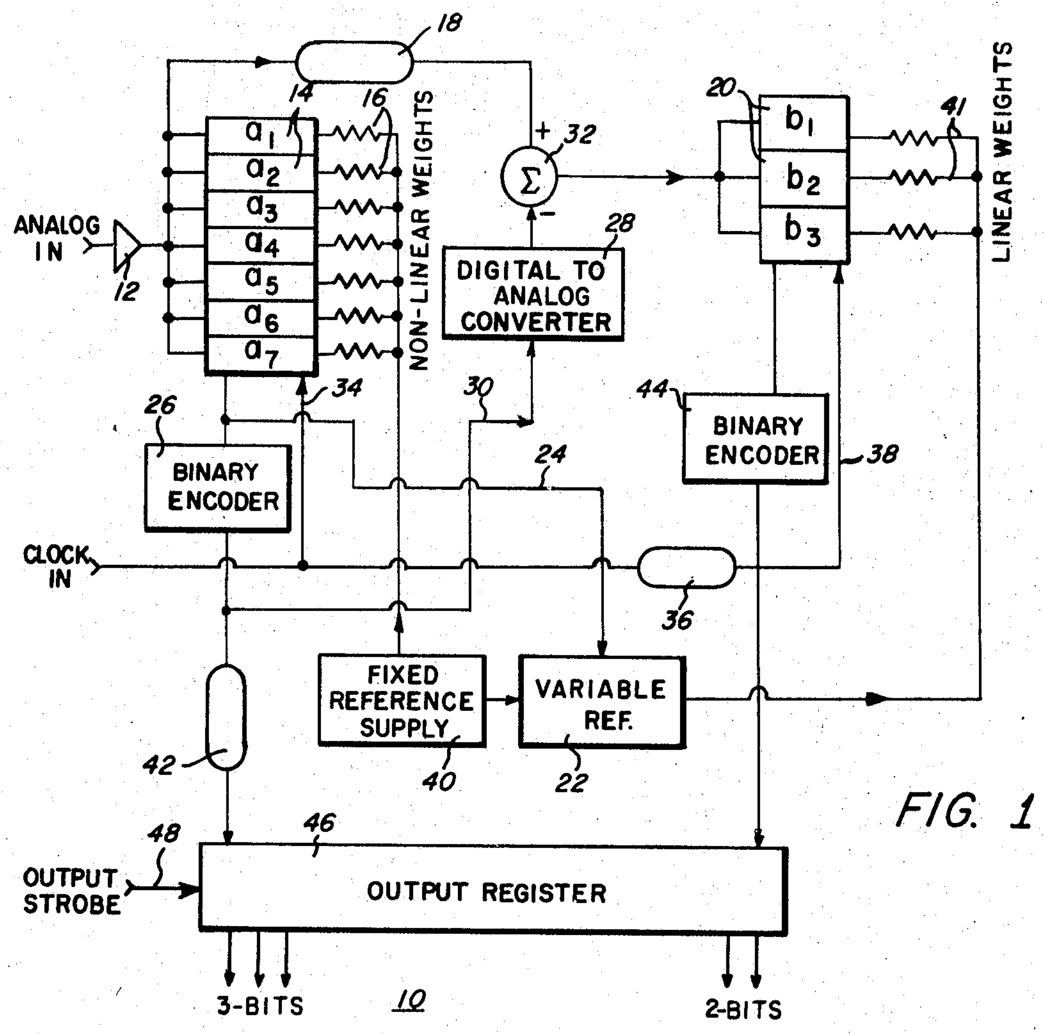
FIG. 1 is a block diagram of a converter of the present invention.

The flow of data through the converter 10 of FIG. 1 is timed such that the "a" comparators 14 are working on a second sample while the "b" comparators 20 work on the first sample. All data from a complete sample arrives simultaneously at the output terminals of the output register 46 as five bits of parallel information. After a clock pulse period of fixed delay which is determined by the delay lines 18, 36 and 42, each of which has an approximately equal delay, a new five-bit sample is available at the output for every clock pulse. This rate of data output can occur up to frequencies which have time periods that approach the basic timing delay provided by the delay lines 18, 36 and 42.

Figure 5A:
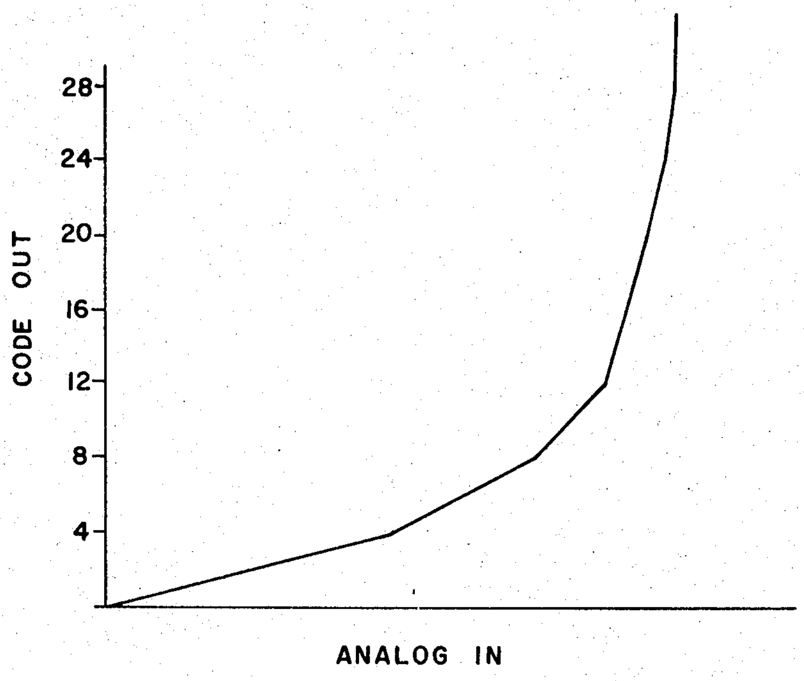
FIGS. 5A and B are graphs of other nonlinear transfer functions which the present invention is capable of converting.
Figure 5B:
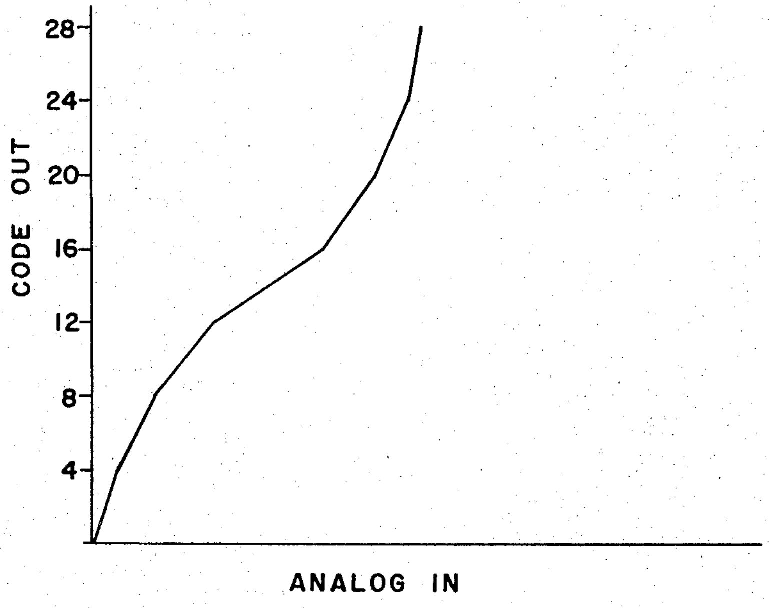

Although the logarithmic transfer function shown in FIG. 2 is apt to be the most common and useful nonlinear function, other curves may be approximated by use of the present invention. FIGS. 5A and B show other nonlinear functions which may be derived from the present invention. FIG. 5a shows an inverse logarithmic transfer function while FIG. 5B shows a more unusual nonlinear transfer function which may be derived from operation of the present invention.

Although the present invention embodied in FIG. 1 has been described in conjunction with a five-bit converter, a closer approximation to a given curve or a greater number of increments in the straight line approximations may be desired. If a closer approximation to a given curve is desired, a greater number of comparators and therefore more bits could be added to the "a" bank of comparators 14. For instance, a given application may require a six-bit machine with 15 comparators in the "a" bank and three comparators in the "b" bank. This configuration would require 15 inputs to the precision ladder network of the variable reference 22 and would result in 16 straight line segments in the approximated curve.

Figure 6:
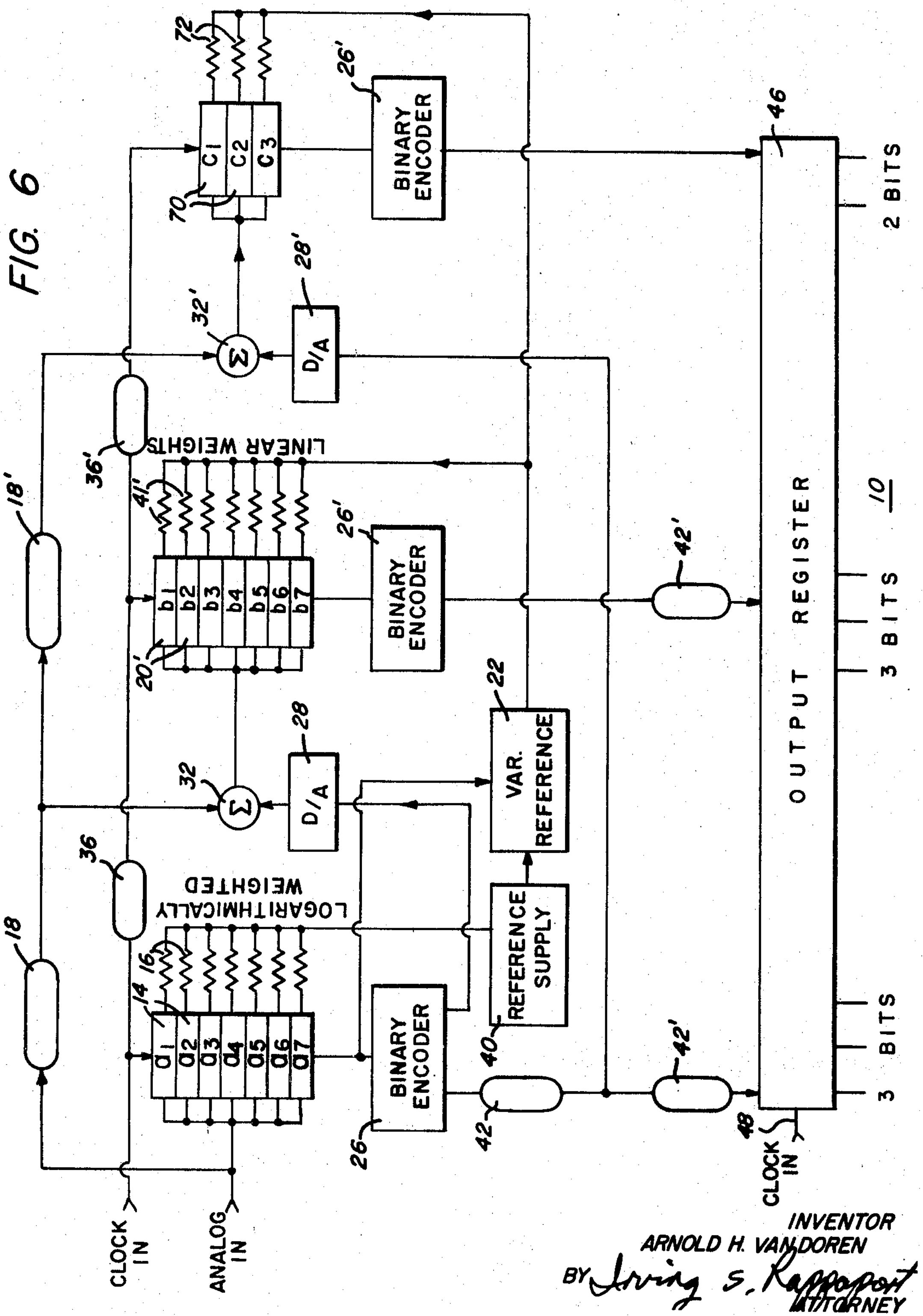
FIG. 6 is a block diagram of another converter employing the present invention and capable of handling a greater number of bits.

If it is desired to have a greater number of increments in the straight line portions making up the desired curve, an alternative configuration such as the converter 10′ shown in FIG. 6 may be constructed. The converter 10′ of FIG. 6 is an eight-bit converter which has the same basic logarithmic straight line approximations of that employed in FIG. 1 but the individual segments are divided into smaller lengths. In this case there will be eight straight line segments but each segment will consist of 32 linear parts. This configuration differs only from that in FIG. 1 in that the "b" comparators 20 of FIG. 1 are replaced by a five-bit linear, parallel, feed-forward converter made up of seven parallel linearly weighted "b" comparators 20″ and three parallel linearly weighted "c" comparators 70. In addition, another delay line 36′ for the clock input is required between the "b" comparators 20′ and the "c" comparators 70. Also, a second summing circuit 32′ is required to take the difference between the delayed analog input and the output from the "b" comparators 20′. Additional delay lines 18′ and 42′ are also required. Also, two additional binary encoders 26′ are needed to encode the outputs from the "b" comparators 20′ and the "c" comparators 70 respectively. Finally, an additional digital-to-analog converter 28′ is required to convert the output from the binary encoder 26′ connected to the "b" comparators 20′. The operation of the eight-bit converter 10′ shown in FIG. 6 is exactly the same as that with respect to the converter 10 shown in FIG. 1.

Amoung the many useful applications of the present invention, it has extremely high value in high speed PCM systems and other applications where signals having a wide dynamic range must be processed. The present invention provides great simplicity and is adapted for high-speed, parallel, feed-forward operation.

The various components referred to, including binary encoders, ladder networks, comparators, summing circuits, storage registers and delay lines, are all standard components which are well known. A reference to standard binary encoders and storage registers is "Digital Computer Fundamentals" by Thomas Bartee. Typical ladder networks as described in conjunction with FIGS. 3A–C may be found in "Analog to Digital Conversion Techniques" by Suskind and comparators and summing circuits may be found in "Pulse, Digital and Switching Waveforms" by Millman and Taub.

It should be understood, of course, that the foregoing disclosure relates to only preferred embodiments of the invention and that numerous modifications or alterations may be made therein without departing from the spirit and the scope of the invention as set forth in the appended claims. relates

I claim:

1. A nonlinear analog-to-digital converter for converting an analog input voltage into a digital output signal, said converter comprising:

an input voltage source;

a plurality of parallel-connected, nonlinearly weighted means fed by said source for determining the portion of the nonlinear scale in which the input voltage lies;

a plurality of parallel-connected, linearly weighted means fed by a signal derived at least in part from said source through signal delay means for dividing the selected portion of the nonlinear scale into substantially straight line segments; and means connected to said linearly weighted means for varying the weighting of said linearly weighted means as a function of the input voltage, said linearly weighted means operating on a first sample of said input voltage while said nonlinearly weighted means operates on a subsequent sample of said input voltage.

2. In combination:

an analog input voltage source;

a plurality of nonlinearly weighted comparator means fed by said source;

a plurality of linearly weighted comparator means fed by a voltage derived in part from said source and in part from the output of said nonlinearly weighted comparator means; and means fed by the output of said nonlinearly weighted comparator means for varying the weighting of said linearly weighted comparator means as a function of the output of said nonlinearly weighted comparator means.

3. The combination in accordance with claim 2 wherein said nonlinearly varying comparator means are fed in parallel from said analog voltage source.

4. The combination in accordance with claim 3 wherein said linearly weighted comparator means are fed in parallel by said signal derived from said analog input voltage source and the output of said nonlinearly weighted comparator means.

5. The combination in accordance with claim 2 wherein said linearly weighted comparator means are fed by a signal derived from said analog input voltage source through time delay means and an output voltage derived from said nonlinearly weighted comparator means.

6. In combination:

a source of input signal samples of an analog voltage;

a first plurality of nonlinearly weighted comparator means fed by said source;

a second plurality of weighted comparator means fed by a signal derived in part from said source and in part from said nonlinearly weighted comparator means; and means supplying said second plurality of comparator means with a varying reference voltage for varying the weighting of said second plurality of weighted comparator means as a function of the output of said nonlinearly weighted comparator means.

7. The combination in accordance with claim 6 wherein said second plurality of weighted comparator means is fed by an analog signal sample is a function of the signal derived from said source minus the signal derived from the output of said comparator means.

8. The combination in accordance with claim 7 wherein the analog signal sample feeding said second plurality of comparator means is derived in part from a signal derived from said source through a time delay and in part from a signal derived from said first plurality of comparator means through a digital to-analog converter.

9. The combination in accordance with claim 8 wherein said second plurality of comparator means is fed by an algebraic summer fed by a signal derived from said source through a delay means and by a signal derived from the output of said first plurality of comparator means through a binary encoder and a digital-to-analog converter.

10. The combination in accordance with claim 9 wherein said second plurality of comparator means are substantially linearly weighted.

11. The combination in accordance with claim 10 wherein said first plurality of comparator means is fed by a fixed comparator reference signal.

* * * * *

UNITED STATES PATENT OFFICE
CERTIFICATE OF CORRECTION

Patent No. 3,646,548 Dated February 29, 1972

Inventor(s) Arnold H. Van Doren

It is certified that error appears in the above-identified patent and that said Letters Patent are hereby corrected as shown below:

In the Specification

Column 1, line 20, change "It" to -- In --.

Column 5, line 17, omit "relates".

In the Claims

Column 6, line 27, Claim 7, after "sample" insert -- which --.

Signed and sealed this 23rd day of January 1973.

(SEAL)
Attest:

EDWARD M.FLETCHER,JR.
Attesting Officer

ROBERT GOTTSCHALK
Commissioner of Patents